United States Patent
Sato et al.

(10) Patent No.: US 11,967,441 B2
(45) Date of Patent: Apr. 23, 2024

(54) METAL WIRING AND CONDUCTIVE SHEET BOTH EXCELLENT IN BENDING RESISTANCE, AND METAL PASTE FOR FORMING THE METAL WIRING

(71) Applicant: TANAKA KIKINZOKU KOGYO K.K., Tokyo (JP)

(72) Inventors: Hiroki Sato, Tsukuba (JP); Yuusuke Ohshima, Tsukuba (JP); Shigeyuki Ootake, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 18/012,647

(22) PCT Filed: Jun. 28, 2021

(86) PCT No.: PCT/JP2021/024293
§ 371 (c)(1),
(2) Date: Dec. 22, 2022

(87) PCT Pub. No.: WO2022/004629
PCT Pub. Date: Jan. 6, 2022

(65) Prior Publication Data
US 2023/0197311 A1  Jun. 22, 2023

(30) Foreign Application Priority Data
Jul. 3, 2020  (JP) .................................. 2020-115366

(51) Int. Cl.
B22F 5/12 (2006.01)
B22F 1/054 (2022.01)
(Continued)

(52) U.S. Cl.
CPC ............... *H01B 1/22* (2013.01); *B22F 1/056* (2022.01); *B22F 1/107* (2022.01); *B22F 3/10* (2013.01);
(Continued)

(58) Field of Classification Search
None
See application file for complete search history.

(56) References Cited

U.S. PATENT DOCUMENTS

2014/0264383 A1* 9/2014 Kajiwara ............ H01L 23/3192
257/77
2015/0041974 A1* 2/2015 Kobayashi ........... B23K 35/365
252/514

(Continued)

FOREIGN PATENT DOCUMENTS

JP  2010/248617 A  * 11/2010
JP  2014-006865 A   1/2014
(Continued)

OTHER PUBLICATIONS

English translation of JP 2010/248617 (originally published Nov. 4, 2010), obtained from PE2E search.*

(Continued)

*Primary Examiner* — George Wyszomierski
(74) *Attorney, Agent, or Firm* — Foley & Lardner LLP (57) ABSTRACT

The present invention relates to a metal wiring, to be formed on a flexible substrate, including a sintered body of silver particles. The sintered body constituting the metal wiring has a volume resistivity of 20 μΩ·cm or less, hardness of 0.38 GPa or less, and a Young's modulus of 7.0 GPa or less. A conductive sheet provided with the metal wiring can be produced by applying/calcinating, on a substrate, a metal paste containing, as a solid content, silver particles having prescribed particle size and particle size distribution, and (Continued)

further containing, as a conditioner, an ethyl cellulose having a number average molecular weight of 10,000 or more and 90,000 or less. The metal wiring of the present invention is excellent in bending resistance with change in electrical characteristics suppressed even through repetitive bending deformation.

6 Claims, 2 Drawing Sheets

(51) Int. Cl.
*B22F 1/107* (2022.01)
*B22F 3/10* (2006.01)
*H01B 1/22* (2006.01)

(52) U.S. Cl.
CPC ........ *B22F 5/12* (2013.01); *B22F 2003/1042* (2013.01); *B22F 2301/255* (2013.01); *B22F 2304/056* (2013.01)

(56) References Cited

U.S. PATENT DOCUMENTS

| 2016/0121404 | A1* | 5/2016 | Makita ................ B22F 1/054 75/370 |
|---|---|---|---|
| 2017/0256332 | A1 | 9/2017 | Miyazaki et al. |
| 2018/0193913 | A1 | 7/2018 | Iwai et al. |
| 2020/0267835 | A1 | 8/2020 | Okimoto et al. |

FOREIGN PATENT DOCUMENTS

| JP | 5795096 B2 | 10/2015 |
|---|---|---|
| JP | 5916159 B2 | 5/2016 |
| JP | 6491753 B2 | 3/2019 |
| JP | 6496775 B2 | 4/2019 |
| JP | 6496784 B2 | 4/2019 |
| JP | 2019-145817 A | 8/2019 |
| WO | WO-2017/033911 A1 | 3/2017 |

OTHER PUBLICATIONS

Long, X. et al., "Estimating the constitutive behaviour of sintered silver nanoparticles by nanoindentation", 2018 19th International Conference on Electronic Packaging Technology, (c) 2018 IEEE, pp. 466-471.*

Chen, C. et al., "Microstructure and mechanical properties of sintered Ag particles with flake and spherical shape from nano to micro size", Materials and Design, vol. 162, pp. 311-321, Available online Dec. 2, 2018.*

International Searching Authority, "International Search Report," issued in connection with International Patent Application No. PCT/JP2021/024293, dated Sep. 21, 2021.

International Searching Authority, "Written Opinion," issued in connection with International Patent Application No. PCT/JP2021/024293, dated Sep. 21, 2021.

* cited by examiner

METAL WIRING AND CONDUCTIVE SHEET BOTH EXCELLENT IN BENDING RESISTANCE, AND METAL PASTE FOR FORMING THE METAL WIRING

CROSS-REFERENCE TO RELATED APPLICATIONS

The present application claims priority under 35 U.S.C. § 371 to International Patent Application No. PCT/JP2021/024293, filed Jun. 28, 2021, which claims priority to and the benefit of Japanese Patent Application No. 2020-115366, filed on Jul. 3, 2020. The contents of these applications are hereby incorporated by reference in their entireties.

BACKGROUND OF THE INVENTION

Field of the Invention

The present invention relates to a metal wiring for constituting a wiring material for mobile devices such as a tablet and a smartphone, a wearable device, and a display. More particularly, it relates to a metal wiring that is to be formed on a flexible substrate, and is so excellent in bending resistance that it can keep electrical characteristics without being disconnected even when repeatedly bent, and a conductive sheet.

Description of the Related Art

In recent years, printed electronics technology is attracting attention as efficient design/production process for circuit substrates of various electric/electronic devices. The printed electronics technology refers to process based on a printing technology in which a metal paste (metal ink) is applied to form a wiring of a circuit substrate. In addition to the efficient process, the printed electronics technology is particularly effective for production of a circuit substrate of a touch panel display of a mobile device or a wearable device required to be reduced in size/weight. When an organic material represented by a light and flexible PET film is used as a substrate, a resultant device can be made light/flexible, and in addition, circuit substrates can be continuously produced by a roll-to-roll method, which is advantageous also in productivity.

A metal paste applied in the printed electronics technology is a dispersion liquid containing conductive metal fine particles of silver or the like dispersed in a solvent. After applying the metal paste to a substrate, the resultant is heated and calcinated to sinter the metal particles, and thus, a conductive wiring/electrode is formed. When an organic substrate is used, a heating and calcinating temperature employed at this point cannot be set to a temperature equal to or higher than a heat resistant temperature of the organic substrate, and hence the process needs to be performed with a calcinating temperature for the metal paste set to a low temperature of 200° C. or less.

Considering merits of the printed electronics technology described above and a metal wiring formed thereby, the present applicant has revealed many findings on various metal pastes and metal wirings, and methods for producing these (Patent Document 1 to Patent Document 5). In these prior art described by the present applicant, a metal paste/metal ink in which metal particles of silver or the like protected by a protective agent such as amine are dispersed in an appropriate solvent and an optional additive is a basic technique. In these prior art documents, it is also revealed that characteristics according with various requirements in properties and production efficiencies of a metal wiring and a conductive sheet are provided. Specifically, a metal paste according to the present applicant can be sintered at a comparatively low temperature, and a low resistance metal wiring can be produced (Patent Documents 1 and 2). When low-temperature sinterability is thus imparted to a metal paste, there is no need to concern thermal damage of a substrate, and a resin material and the like can be applied to the substrate, and thus, choice of substrate material can be expanded. Besides, according to technique to form a metal wiring of the present applicant, a very fine metal wiring can be formed in a highly refined pattern (Patent Document 3). In addition, the present applicant has also disclosed a method for preventing visualization of a metal wiring through light reflection by suppressing metallic luster of a metal particle (Patent Document 4).

PRIOR ART DOCUMENT

Patent Document

Patent Document 1
Japanese Patent No. 5795096
Patent Document 2
Japanese Patent No. 6491753
Patent Document 3
Japanese Patent No. 5916159
Patent Document 4
Japanese Patent No. 6496775
Patent Document 5
Japanese Patent No. 6496784

SUMMARY OF THE INVENTION

Technical Problem

In recent years, development of a model of a smartphone and the like including a touch panel screen foldable for compactness has been announced. Besides, foldable displays have been developed as displays of PCs, tablets and the like. In addition, wearable devices are required to be deformable for employing curved surface design or for following movement of a body in consideration of wear comfortability and fashionability. Therefore, conductive sheets used in such a variety of devices are subjected to repetitive bending deformation. Besides, the bending direction is not always fixed to one direction but some devices are subjected to bidirectional bending deformation.

In such a conductive sheet, it is concerned that a metal wiring may change in electrical characteristics (resistance value), or be disconnected at the worst case, in accordance with the repetitive bending deformation. In particular, in a touch panel display of the foldable smartphone described above, a bending curvature radius (R) is considerably small, and it is presumed that the change in the electrical characteristics and the like of the metal wiring is significant. Therefore, a metal wiring used in a conductive sheet is required to have such durability that the change in the electrical characteristics is small even through repetitive bending deformation (it is noted that such durability against repetitive bending deformation is designated as bending resistance in the present invention).

Regarding the bending resistance of a metal wiring, the present inventors have confirmed that the above-described conventional metal paste and a metal wiring formed therefrom cannot be evaluated to have required durability in some cases. In this regard, the present applicant has disclosed, as a conductive sheet having bending resistance, a conductive sheet described in Patent Document 5. In this prior art, two systems of metal wirings necessary for device control are formed in one layer each on the both surfaces of a substrate to increase a curvature radius in bending deformation applied to each metal wiring, thereby securing durability.

The conductive sheet provided by the present applicant is, however, improved in the bending resistance from the viewpoint of the structure of the conductive sheet, and is not assumed to be improved in the property of the metal wiring itself. Therefore, this technique cannot be always applied to devices having various structures. Besides, it is not clear that even this conductive sheet can endure severe repetitive bending deformation as in a foldable smartphone. In order to cope with severe repetitive bending deformation regardless of the structure of a conductive sheet, it is deemed that it is preferred to impart bending resistance to a metal wiring itself.

The present invention, which has been achieved under the above-described circumstances, relates to a metal wiring to be formed on a conductive sheet to which a flexible substrate is applied, and provides a metal wiring excellent in bending resistance with change in electrical characteristics suppressed even through repetitive bending deformation with a small curvature radius. Besides, it provides a conductive sheet provided with such a metal wiring.

Solution to Problem

The present inventors have decided to optimize a constitution of a metal wiring based on a metal wiring made of a metal paste containing metal particles of the related art. It is not that conventional metal wiring made of a metal powder has no durability against bending deformation. This can be inferred based on that a metal paste is applied to the conductive sheet having bending resistance provided by the present applicant (Patent Document 5).

The present inventors have made, with a powder including silver applied as the metal powder, strict examination from various angles on the constitution of the metal paste containing the silver powder. Then, bending resistance of a metal wiring produced from such a metal paste has been examined, resulting in finding relation between a prescribed physical property and bending resistance of a metal wiring including a silver powder. It has been found that a metal wiring including a silver powder and strictly specified in hardness and a Young's modulus in particular is excellent in bending resistance, resulting in accomplishing the present invention.

Specifically, the present invention is drawn to a metal wiring, to be formed on a flexible substrate, containing a sintered body of silver particles, in which the sintered body has a volume resistivity of 20 $\mu\Omega \cdot cm$ or less, hardness of 0.38 GPa or less, and a Young's modulus of 7.0 GPa or less. Now, constitutions of the metal wiring of the present invention, and a conductive sheet including the same will be described in detail.

(I) Metal Wiring of the Present Invention

As described above, the metal wiring of the present invention contains a sintered body of silver particles. Silver is selected as a constituent metal of the metal wiring in consideration of eligibility of silver as a wiring material such as conductivity (low resistance) and chemical stability. Besides, one of factors that the sintered body to be used as the metal wiring exhibit hardness and a Young's modulus described below is probably obtained by application of silver particles. The present invention contains the sintered body of silver particles, and in the present invention, sinter means a state in which silver particles adjacent to one another are bound to one another with a force sufficient for avoiding the sintered body from being collapsed under its own weight. In this regard, the term is not limited to a state in which plastic deformation and necking among constituent particles are caused to strongly bond particles to one another as in "sinter" formed by a powder metallurgy method, but is interpreted in a broad sense. The metal wiring of the present invention containing the sintered body of silver particles has, for improving bending resistance, characteristics in the hardness and the Young's modulus, and has suitable ranges of a particle size and a particle size distribution of the silver particles. These constitutions will now be described.

(I-1) Hardness and Young's Modulus of Sintered Body

In the metal wiring of the present invention, the hardness and the Young's modulus of the sintered body contained therein are specified because it has been confirmed that a sintered body having values of these physical properties beyond the upper limits is inferior in bending resistance, and is increased in electrical characteristics (resistance value) as the number of times of bending increases through repetitive bending deformation. In defining the constitution of the metal wiring of the present invention containing the sintered body of silver particles, the optimum method is specification of the hardness and the Young's modulus. In directly specifying the constitution of the sintered body of silver particles, a range of constituent elements is very wide. Specifically, a large number of constituent elements such as the particle size and the particle size distribution of the silver particles, and bond strength between the particles as well as a content (residual amount) of an organic substance derived from an additive (such as ethyl cellulose) contained in a metal paste described later are presumed. It is presumed that these constituent elements are mutually and complicatedly involved in the metal wiring of the present invention. It is difficult to specify these constituent elements, but it is the hardness and the Young's modulus of the sintered body that are exhibited through involvement of each of these elements. In the present invention, the constitution of the metal wiring is specified by restricting the hardness and the Young's modulus of the sintered body.

As described above, the metal wiring of the present invention needs to have hardness of 0.38 GPa or less and a Young's modulus of 7.0 GPa or less. A metal wiring having larger values than these is insufficient in bending resistance. Both the hardness and the Young's modulus need to be equal to or less than the numerical values, and a metal wiring having a larger value of either of these is inferior in bending resistance. Besides, in order to obtain durability against bending deformation with a smaller curvature radius, it is preferred that the hardness is 0.30 GPa or less and the Young's modulus is 6.0 GPa or less.

The lower limits of the hardness and the Young's modulus are preferably hardness of 0.18 GPa or more and a Young's modulus of 5.2 GPa or more. A metal wiring having hardness and a Young's modulus less than these values is insufficient in strength, and hence the wiring is so fragile that it may be broken with a small pressure and may not stably keep the shape. Such a wiring may be varied in a resistance value during use, and in another case, a problem may occur also in, for example, process for producing a conductive sheet. In the process for producing a conductive sheet, a step of winding the produced conductive sheet may be additionally performed. During this winding, there is a possibility that the wiring may be damaged by a pressure applied to the sheet surface so as to increase the resistance value.

For measuring the hardness and the Young's modulus of the metal wiring of the present invention, when the line width or the line thickness is large, the measurement can be performed with a general hardness meter (a Vickers hardness meter or a micro Vickers hardness meter) and a tensile test used together. The metal wiring of the present invention is, however, intended to be applied to a fine wiring. As a technique for measuring the hardness and the Young's modulus of such a narrow and thin metal wiring, a nanoindentation method is known, and is effectively applied in the present invention. The nanoindentation method is a method for measuring hardness and a Young's modulus based on a load and an indentation depth in pushing, into a measurement target, an indenting head provided in a measurement apparatus designated as a nanoindentor. The load applied by the indenting head of the nanoindentor is precisely controlled by electromagnetic control, and an amount of movement of the head is electrically precisely measured. Through the measurement with the nanoindentor, contact rigidity (stiffness) and a contact depth of the measurement target can be obtained, and the hardness and the Young's modulus can be calculated based on these. A method for measuring a physical property by the nanoindentation method is standardized as a nanoindentation test by International Organization for Standardization (ISO) (ISO 14577).

(I-2) Constitution of Silver Particles Constituting Sintered Body (i) Average Particle Size of Silver Particles The metal wiring of the present invention is a sintered body of silver particles. Here, the silver particles constituting the sintered body has an average particle size of preferably 100 nm or more and 200 nm or less. According to the present inventors, the average particle size of the silver particles is involved in the hardness and the Young's modulus of the metal wiring of the sintered body, and can affect the bending resistance. In particular, a sintered body of fine silver particles having an average particle size less than 100 nm tends to increase the hardness and the Young's modulus, and hence, the bending resistance of the resultant metal wiring is insufficient. Alternatively, silver particles having an average particle size over 200 nm are inferior in low-temperature sinterability, and hence an electrical resistance value obtained after calcination is increased, and may be over 20 $\mu\Omega$·cm. In order to obtain more favorable bending resistance, the average particle size of the silver particles is preferably 120 nm or more and 180 nm or less, and more preferably 140 nm or more and 180 nm or less.

(ii) Particle Size Distribution (Standard Deviation) of Silver Particles

As for the particle size distribution of the silver particles constituting the metal wiring, a sintered body of silver particles having comparatively varying sizes is preferably applied in the present invention. Specifically, silver particles having a standard deviation of the particle size of 40 nm or more and 120 nm or less are preferred. When the silver particles have even particle sizes, namely, when the standard deviation is small, an excessively dense sintered body is formed. In such a sintered body, the hardness and the Young's modulus increases, and hence the bending resistance decreases. Alternatively, when the particle size variation of the silver particles is too large, namely, when the standard deviation is too large, the hardness and the Young's modulus may be insufficient on the contrary.

(iii) Purity of Silver Particles

The silver particles constituting the metal wiring of the present invention has a purity of preferably 97% by weight or more. A purity of 97% by weight or less may increase a sintering temperature, increase the electrical resistance value, and decrease the bending resistance.

(I-3) Constitution of Sintered Body (i) Volume resistivity of Sintered Body

The metal wiring of the present invention contains the sintered body of the silver particles, and owing to this, has a volume resistivity of 20 $\mu\Omega$·m or less (at 20° C.). This volume resistivity is different from a resistivity that can be exhibited by a thin wire/thin film containing dense (bulk) silver that is not a sintered body. Bulk silver has a volume resistivity of about 1.6 $\mu\Omega$·cm. It is noted that the volume resistivity of the metal wiring is preferably as low as possible, and that the lower limit of the volume resistivity of the metal wiring of the present invention is 2.0 $\mu\Omega$·cm or more.

(ii) Thickness of Sintered Body

In the present invention, the thickness of the sintered body of the silver particles corresponding to the metal wiring is set preferably to 1 $\mu$m or more and 20 $\mu$m or less. A metal wiring having an excessively large thickness tends to be inferior in bending resistance, and is largely changed in the resistance value through repetitive bending deformation. Besides, when the thickness of a metal wiring containing a sintered body of silver particles is excessively small, uniformity in resistance value may be deteriorated. In consideration of these, the thickness of the metal wiring is preferably set to the above-described range. The thickness of the metal wiring is more preferably 10 $\mu$m or less.

(iii) Other Constitution of Sintered Body

The sintered body of the silver particles constituting in the metal wiring of the present invention basically constituted of silver (silver powder). The sintered body, however, inherently has a few voids. Such voids of the silver powder may contain an organic substance such as ethyl cellulose. Such an organic substance drives from a conditioner used as a component of a metal paste, that is, a precursor of the sintered body, or an additive. Such an organic substance is contained, however, in a very small content, and hence is difficult to be quantitatively determined by ordinary analysis means. The present inventors presume that not only the particle size and the like of the silver particles but also these voids, and the presence and existing state of an organic substance affect the bending resistance of the sintered body (metal wiring). The content of an organic substance is, however, difficult to be specified. In the present invention, considering that these various factors complicatedly affect the bending resistance, the hardness and the Young's modulus are applied as the means for specifying the metal wiring.

(II) Conductive Sheet of the Present Invention

A conductive sheet of the present invention provided with the metal wiring described above will now be described. The conductive sheet of the present invention is constituted by forming the metal wiring of the present invention described above on at least one surface of a flexible substrate.

(II-1) Substrate

The substrate applied in the conductive sheet of the present invention is not especially limited in either of the material, the shape and the dimension. In consideration of the problems to be solved by the present invention, however, the substrate is constituted of a flexible material capable of bending deformation. Examples of the material of the substrate include a metal, a resin, and a plastic. There is no need to specify the flexibility of the substrate, and since application to a conductive sheet used in a foldable device is taken into consideration in the present invention, a substrate made of a material and having a dimension that has flexibility capable of being folded at a curvature radius of 1 mm or less, and more preferably 0.5 mm or less is preferred.

Figure 1:
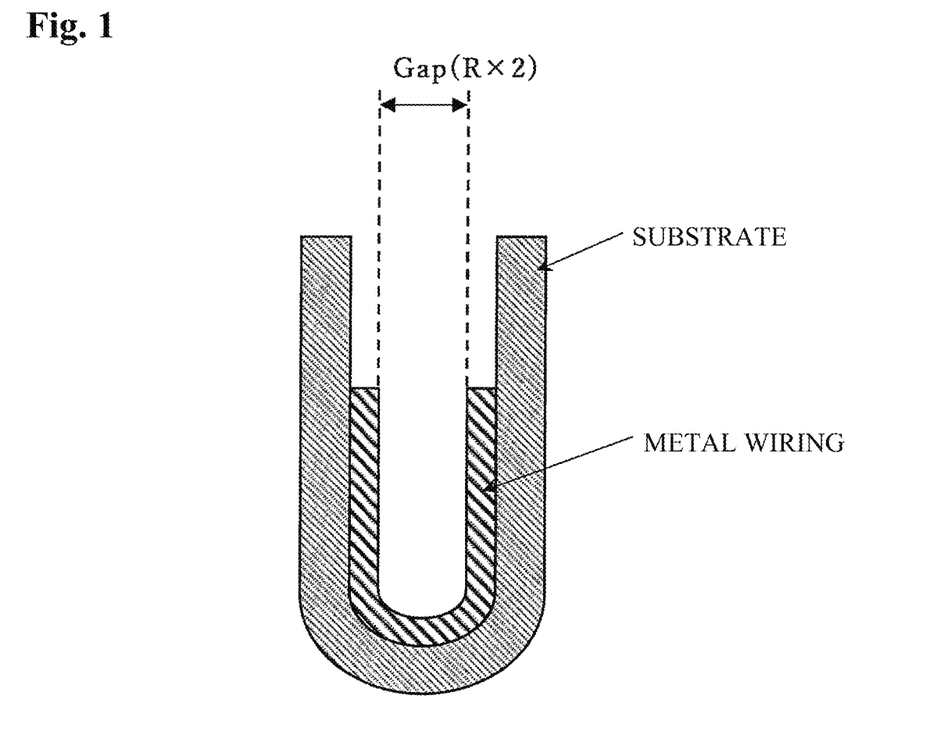
FIG. 1 is a diagram for explaining a curvature radius (R) in bending deformation of a conductive sheet.

In the present invention, the curvature radius of a conductive sheet in bending deformation refers to a half value of a distance (gap) caused inside the bending. For example, when bending deformation is caused with a surface having a metal wiring formed inside as illustrated in FIG. 1, a half distance of a distance between the metal wirings is defined as the curvature radius R. When bending deformation is caused with a surface having a metal wiring formed outside, a half distance of a distance between inside surfaces of a substrate corresponds to the curvature radius R.

Besides, since the present invention is applicable to bending deformation with a small curvature radius R, durability also against bending deformation with a large curvature radius R can be naturally provided. Besides, although the substrate needs to be flexible, there is no need to always apply bending deformation thereto. Accordingly, there is no upper limit in the curvature radius R of the conductive sheet, and a case where the conductive sheet has a curvature of 0 can be encompassed.

Besides, in consideration of application to a display device such as a display or a touch panel, the substrate preferably includes a transparent material. From these points, specific examples of the material of the substrate include polyethylene terephthalate (PET), polyimide (PI), and polyamide.

It is noted that the substrate need not always have a single layer structure. For example, a substrate having a multilayer structure including a primer layer including a resin or the like formed on a substrate of the above-described material can be also a substrate of the present invention. The primer layer is formed for improving adhesion between the metal wiring and the substrate, and is constituted of, for example, a resin material such as an epoxy-based resin. The primer layer is involved in the adhesion of the metal wiring, but does not affect the bending resistance itself of the metal wiring. The metal wiring of the present invention has bending resistance by itself, and hence it is not essential to form the primer layer on the substrate.

(II-2) Metal Wiring on Substrate

In the conductive sheet of the present invention, a metal electrode is formed on at least one of the front surface and the rear surface of the substrate. A formation pattern of the metal electrode is not limited, and is freely set in accordance with designed contents of a circuit substrate to be applied, such as a parallel wiring pattern, or a cross grid wiring pattern. The constitutions of the metal wiring (the average particle size of the silver particles and the like) to be formed on the substrate are the same as those described above.

The dimension of the metal wiring is not also especially limited. The thickness of the metal wiring is, however, set preferably to 1 μm or more and 20 μm or less from the viewpoint of bending resistance as described above.

(II-3) Another Constitution of Conductive Sheet

The conductive sheet of the present invention has a basic constitution including the substrate and the metal wiring described above, and may include, as another constitution, a coating layer covering the substrate together with the metal wiring. The coating layer is formed for purposes of preventing migration of the metal wiring, for moisture proof/antioxidation, for preventing peeling and the like. The coating layer may be formed as a top coat for scratch prevention as a surface layer of the conductive sheet in some cases. As for a material of such a coating layer, when it is, for example, a coating layer for preventing migration, examples of the material include resins such as a fluorine resin, an acrylic resin, an epoxy resin, an alkyd resin, a vinyl resin, a phenol resin, and a silicon resin. Alternatively, examples of the material of a coating layer for purpose of a top coat include a fluorine resin, an acrylic resin, an epoxy resin, an alkyd resin, a vinyl resin, a phenol resin, and a silicon resin. The coating layer may be formed as a single layer, or a plurality of types of layers may be combined to be applied. The thickness of the coating layer is adjusted in accordance with the use and a material to be used, and is not especially limited.

One of particularly preferable use forms of the conductive sheet of the present invention described above is a constituent member of a display device such as a display or a touch panel. For example, when a flexible cover glass or protective film is adhered to the conductive sheet of the present invention, and a control connector and the like are connected thereto, a display or the like can be produced.

(III) Metal Paste for Forming Metal Wiring of the Present Invention

As described above, the metal wiring of the present invention contains the sintered body of the silver particles, and the sintered body is produced by using, as a precursor, a metal paste containing the silver particles. In the present invention, relation between the constitution of the metal paste and the physical properties (the hardness and the Young's modulus) of the sintered body obtained therefrom has been examined, resulting in finding a metal paste suitable for producing the metal wiring having bending resistance.

The metal paste of the present invention contains a solid content of silver particles, a solvent, a conditioner, and an optional organic additive, the solid content is constituted of silver particles having an average particle size of 100 nm or more and 200 nm or less, and having a standard deviation of the particle size of 40 nm or more and 120 nm or less, the silver particles constituting the solid content have, as a protective agent, at least one amine compound having 4 or more and 8 or less carbon atoms bound thereto, and the conditioner is an ethyl cellulose having a number average molecular weight of 10,000 or more and 90,000 or less. As described so far, the metal paste of the present invention contains the solid content of the silver particles, the solvent, the conditioner, and the optional organic additive. These components will now be described.

(III-1) Silver Particles (Solid Content) of Metal Paste

In the metal paste of the present invention, a range of the particle size of the silver particles of the solid content is an average particle size of 100 nm or more and 200 nm or less. This is for causing the hardness and the Young's modulus, which affect the bending resistance of the sintered body (metal wiring), to fall within the preferable ranges. A sintered body of fine silver particles having an average particle size less than 100 nm is formed as a sintered body denser than necessary, and tends to increase the hardness and the Young's modulus. On the other hand, silver particles having an average particles size over 200 nm are inferior in low-temperature sinterability, and hence an electrical resistance value obtained after calcination is disadvantageously increased. The average particle size of the silver particles is more preferably 120 nm or more and 180 nm or less, and further preferably 140 nm or more and 180 nm or less.

As for the particle size distribution of the silver particles of the metal paste, the standard deviation of the particle size of the silver particles is 40 nm or more and 120 nm or less.

When silver particles having a small standard deviation and having even particle sizes are applied, the silver particles agglomerate without gaps at a stage of applying the paste, and thereafter, a dense sintered body is formed. A dense sintered body increases the hardness and the Young's modulus, and decreases the bending resistance. In this regard, in a conventional general metal paste, it tends to be preferable to apply silver particles having a sharp peak in the particle size distribution, and having even particle sizes. In the present invention, from the viewpoint of adjustment of the hardness and the Young's modulus for improving the bending resistance of the sintered body, a metal paste containing silver particles having comparatively varying particle sizes is applied on the contrary to the conventional trend. When the variation in the particle size of the silver particles is too large, however, silver particles having unpreferable particle sizes may be contained in the paste. For example, when the average particle size is 180 nm, if the standard deviation is too large, a content of particles having an average particle size of 200 nm or more is increased, which may result in deteriorating low-temperature sinterability. For these reasons, the standard deviation of the particle size of the silver particles is 40 nm or more and 120 nm or less in the present invention.

As a method for producing the silver particles having the above-described average particle size and particle size distribution, a thermal decomposition method using a silver compound having a pyrolytic property as a raw material is suitable. In the thermal decomposition method, a silver compound, such as silver oxalate ($Ag_2C_2O_4$), silver carbonate ($Ag_2CO_3$), or silver oxide ($Ag_2O$), capable of precipitating silver through thermal decomposition is used as a raw material, an organic compound such as amine is mixed with the raw material to form a silver-amine complex, and this complex is heated/decomposed to precipitate silver particles. The metal paste can be produced by collecting the silver particles thus precipitated, and adding them to a solvent. A protective agent (amine compound) for the silver particles described later has been added at a stage of generating the silver-amine complex.

In the thermal decomposition method, the average particle size of the silver particles can be adjusted by adjusting various production conditions such as a heating temperature for the amine complex, a heating rate, and a water content in a reaction system. Besides, in the metal paste of the present invention, it is necessary to increase variation (standard deviation) in the particle size distribution of the silver particles. As a method for imparting such variation to the silver particles contained in the metal paste, a method in which a cooling rate is controlled after heating and synthesizing the silver particles as described below in the production process of the silver particles can be included.

A reaction for precipitating the silver particles from the amine complex proceeds at a heating temperature of a prescribed high temperature (of, for example, 100° C. or more), and the silver particles can be grown to a desired particle size by continuing the heating at this temperature. At this stage of heating, all particles present in the reaction system are sintered, and hence the average particle size is increased, but variation is unlikely to increase. The heating is stopped at a stage where the desired average particle size of the silver particles is achieved, but residual heat remains in the reaction system even after stopping the heating, and hence the sintering of the silver particles is continued by the heat. At this point, if the reaction system is rapidly cooled after stopping the heating, the sintering of the silver particles by the residual heat is uniformly suppressed, and thus, silver particles having even particle sizes can be obtained. Therefore, in order to cause the silver particles to have varying particle sizes, it is necessary to cause the sintering of the silver particles to partially proceed in the cooling process of the reaction system after stopping the heating. Specifically, in cooling the reaction system, variation can be caused in the particle size of the silver particles by controlling a cooling rate in an intermediate temperature range (60 to 90° C.). The cooling rate is preferably set to 1° C./min or less in a region from the high temperature range at the time of stopping the heating to the reaction system reaching 60° C. When the cooling is performed at a cooling rate equal to or higher than this rate, the sintering is suppressed as described above, and hence the variation in the particle size is insufficient.

Regarding the silver particles described so far, a content thereof in the metal paste is preferably 60% by mass or more and 75% by mass or less with respect to the total mass of the paste. When the silver particle content in the metal paste is increased, a sintered body having a large thickness can be produced efficiently. When the content of the silver particles is less than 60% by mass, the production efficiency of the sintered body is inferior. When the silver particles are contained in a content over 75% by mass, however, the hardness and the Young's modulus are increased, and hence the resultant sintered body is inferior in bending resistance.

In the metal paste of the present invention, the silver particles are dispersed in a solvent while in a state of being bound to an amine compound having 4 to 8 carbon atoms on average used as a protective agent. The protective agent refers to a compound bound to a partial or whole surface of a metal particle, and is an additive for suppressing agglomeration of metal particles in a dispersion liquid, such as a metal paste, in which the metal particles are dispersed. In the present invention, one or a plurality of amine compounds bind to the silver particles as the protective agent. At this point, the protective agent bound to the silver particles is an amine compound having 4 to 8 carbon atoms on average as a whole. The number of carbon atoms on average as a whole refers to, in the one or plural amine compounds contained in the metal paste, the number of carbon atoms calculated by proportionally dividing the number of carbon atoms of these compounds by the amount added (mole fraction). This is an average value of the numbers of carbon atoms obtained assuming that the amine compounds contained in the metal paste uniformly bind to the silver particles.

The protective agent applied in the present invention is specified to an amine compound in order to sinter the silver particles at a comparatively low temperature (a temperature of, for example, 150° C. or less). In the present invention, a flexible resin or plastic is applied as the substrate in many cases. If a high temperature is required for sintering the silver particles, the substrate may be thermally damaged. An amine compound volatilizes at a comparatively low temperature, and can urge sintering between the silver particles. Besides, the amine compound used as the protective agent is specified to have 4 to 8 carbon atoms on average because an amine having less than 4 carbon atoms on average is poor in protecting function, and is difficult to cause the silver particles to stably exist. On the other hand, an amine having more than 8 carbon atoms on average requires a high sintering temperature for forming a wiring having a prescribed low resistance value. It is noted that an amine having 9 or more carbon atoms and having a comparatively large molecular weight can be applied and added as long as an average number of carbon atoms of a protective molecule is 8 or less. For example, a mixture of an amine having 4 carbon atoms and an amine having 12 carbon atoms can be used as the protective agent. In this case, an average number of carbon atoms may be 8 or less per molecule.

As the amine compound, a (mono)amine having 1 amino group, or a diamine having 2 amino groups can be applied. The number of hydrocarbon groups bound to an amino group is preferably 1 or 2, and a primary amine ($RNH_2$) or a secondary amine ($R_2NH$) is preferred. When a diamine is applied as the protective group, at least one or more amino groups are preferably a primary amine or a secondary amine. A hydrocarbon group bound to an amino group may be a chain hydrocarbon having a linear structure or a branched structure, or a hydrocarbon group having a cyclic structure. Besides, oxygen may be partially contained.

Suitable specific examples of the protective agent applied in the present invention include amine compounds such as butylamine (4 carbon atoms), 1,4-diaminobutane (4 carbon atoms), 3-methoxypropylamine (4 carbon atoms), pentylamine (5 carbon atoms), 2,2-dimethylpropylamine (5 carbon atoms), 3-ethoxypropylamine (5 carbon atoms), N,N-dimethyl-1,3-diaminopropane (5 carbon atoms), hexylamine (6 carbon atoms), heptylamine (7 carbon atoms), benzylamine (7 carbon atoms), N,N-diethyl-1,3-diaminopropane (7 carbon atoms), octylamine (8 carbon atoms), 2-ethylhexylamine (8 carbon atoms), nonylamine (9 carbon atoms), decylamine (10 carbon atoms), and dodecylamine (12 carbon atoms).

The amount of the protective agent (amine compound) in the metal paste of the present invention is preferably 80 ppm or more and 27,000 ppm or less on a weight basis of the metal paste. When the amount is less than 80 ppm, the effect of protecting the silver particles is insufficient, and dispersibility of the silver particles in the metal paste is deteriorated. When the amount is over 27,000 ppm, it is concerned that the protective agent may remain in the sintered body, which may affect the hardness and the Young's modulus of the sintered body.

(III-2) Conditioner

The metal paste of the present invention contains, together with the silver particles of the solid content, an ethyl cellulose having a number average molecular weight of 10,000 or more and 90,000 or less as a conditioner. In forming the metal wiring (sintered body) of the present invention, an ethyl cellulose having a number average molecular weight falling within this range is an essential component.

In this regard, the particle size and the particle size distribution of the silver particles described above are also factors affecting the physical properties of the sintered body, but even when only the silver particles contained in the metal paste are optimized, the metal paste not containing an ethyl cellulose having a number average molecular weight falling within the above-described range cannot form a metal wiring having bending resistance. The present inventors presumed that the effect of the conditioner is exhibited during sintering process of the silver particles. It is considered that when the conditioner having an appropriate number average molecular weight is dispersed together with the silver particles having the prescribed particle size/particle size distribution, movement and a filling state of the silver particles obtained when the metal paste is applied to a substrate become favorable, and thereafter, a sintered body favorable for bending resistance is obtained.

The number average molecular weight of the ethyl cellulose, that is, an essential constitution of the metal paste, is specified to 90,000 or less because when a high molecular weight ethyl cellulose having a number average molecular weight over 90,000 is added as the conditioner, the resultant paste increases in viscosity, and hence is inappropriate to printing. On the other hand, an ethyl cellulose having an excessively low number average molecular weight makes it difficult to secure denseness of the resultant sintered body, and it is difficult to obtain a low resistance metal wiring. From this point of view, the lower limit of the number average molecular weight of the ethyl cellulose is 10,000 or more.

The metal paste preferably contains an ethyl cellulose having a number average molecular weight of 10,000 or more and 60,000 or less. This is because such a comparatively low molecular weight ethyl cellulose is considered to have an effect of further improving the bending resistance of the resultant sintered body. In a metal paste containing a low molecular weight ethyl cellulose, even when a high molecular weight ethyl cellulose having a number average molecular weight over 60,000 and 90,000 or less is simultaneously contained, the bending resistance is satisfactory as a preferable aspect. It is presumed that a high molecular weight ethyl cellulose has an effect of satisfactorily adjusting printability of the metal paste. In metal wiring forming process with a metal paste, process of applying the metal paste on a substrate by screen printing or the like is employed in many cases. When a high molecular weight ethyl cellulose is added in addition to a low molecular weight ethyl cellulose, the printability can be improved, so that adhesion of the paste to a squeegee during the application of the metal paste and transfer failure to a substrate can be suppressed. It is, however, concerned that an ethyl cellulose having an excessively high molecular weight may deteriorate the printability due to viscosity increase of the paste as described above, and therefore, even when a low molecular weight ethyl cellulose is contained, an ethyl cellulose having a molecular weight over 90,000 should not be added.

The content of the ethyl cellulose having a number average molecular weight of 10,000 or more and 90,000 or less used as the conditioner is preferably 0.50% by mass or more and 2.6% by mass or less in terms of a mass ratio to the entire paste. When the content is less than 0.50% by mass, the effect of the addition of the ethyl cellulose is difficult to obtain. Besides, since mixture of an excessive amount of ethyl cellulose decreases the resistance value of the resultant sintered body, the upper limit is 2.6% by mass. As described above, as the conditioner of the metal paste, a low molecular weight ethyl cellulose (number average molecular weight of 10,000 or more and 60,000 or less) and a high molecular weight ethyl cellulose (number average molecular weight over 60,000 and 90,000 or less) can be both simultaneously added. Even in this case, the total content of these ethyl celluloses preferably falls within the above-described range. When a metal paste thus containing two or more ethyl celluloses is to be produced, the respective ethyl celluloses may be successively added to a solvent, or a mixture of two or more ethyl celluloses obtained in advance may be added to a solvent.

In a metal paste simultaneously containing both a low molecular weight ethyl cellulose (number average molecular weight of 10,000 or more and 60,000 or less) and a high molecular weight ethyl cellulose (number average molecular weight over 60,000 and 90,000 or less), assuming that a content on a mass basis of the high molecular weight ethyl cellulose to the metal paste is $C_H$ (% by mass) and that a content on a mass basis of the low molecular weight ethyl cellulose is $C_L$ (% by mass), a ratio of $C_H$ to $C_L$ ($C_H/C_L$) is preferably 5 or more. The upper limit of the ratio of $C_H$ to $C_L$ ($C_H/C_L$) is not especially specified. This is because even the high molecular weight ethyl cellulose alone can impart bending resistance to some extent to the sintered body. In order to form a metal wiring capable of coping with bending deformation with a very small curvature radius, however, the ratio of $C_H$ to $C_L$ is preferably set to 9 or less.

(III-3) Solvent

When the above-described silver particles and conditioner are mixed/dispersed in a solvent, the metal paste of the present invention is obtained. The solvent is preferably an organic solvent having 8 to 16 carbon atoms, containing an OH group in the structure, and having a boiling point of 280° C. or less. The solvent needs to be volatilized/removed in sintering the silver particles after applying the metal paste. In order to sinter the silver particles and remove the solvent at a comparatively low temperature, a solvent having a boiling point of 280° C. or less is preferred. Preferable specific examples of the solvent include terpineol (C10, boiling point: 219° C.), dihydroterpineol (C10, boiling point: 220° C.), Texanol (C12, boiling point: 260° C.), 2,4-dimethyl-1,5-pentadiol (C9, boiling point: 150° C.), and 2,2,4-trimethyl-1,3-pentanediol diisobutyrate (C16, boiling point: 280° C.). A mixture of a plurality of solvents may be used, or one solvent may be singly used.

As for a mixing ratio among the solvent and the other components (the silver particles (the protective agent), and the conditioner) in the entire metal paste, a solvent content is preferably 19% by mass or more and less than 40% by mass in a mass ratio to the entire paste. When the content is less than 19% by mass, the resultant paste has such a high viscosity that it is difficult to be applied for printing, and when the content is over 40% by mass, the viscosity is so low that it is difficult to perform screen printing.

(III-4) Optional Organic Additive

In addition to the above-described essential constitutions, the metal paste of the present invention can contain an organic compound as an optional additive. Specifically, a primer or the like for improving adhesion to a printing substrate can be added. The amount of such an optional organic additive to be added is preferably 1% by mass or less in terms of a total additive content based on the weight of the paste. It is noted that the metal paste of the present invention does not contain a glass frit generally used in a metal paste for forming what is called an electrode film (thick film). A metal paste for forming a thick film contains metal particles, and hence is similar to the metal paste of the present invention. The metal paste of the present invention is, however, used for forming a fine metal wiring, and is clearly distinguished from the metal paste for forming a thick film. It goes without saying that the metal wiring formed from the metal paste of the present invention does not contain a glass frit component.

(IV) Method for Producing Metal Wiring and Conductive Sheet of the Present Invention The metal wiring of the present invention is produced by applying the metal paste on a substrate, and sintering the silver particles. Besides, the conductive sheet of the present invention is produced by thus forming the metal wiring on the substrate.

As a method for applying the metal paste on a substrate, screen printing, dipping, spin coating, a roll coater or the like can be applied. For forming a patterned fine metal wiring, screen printing is preferably applied. In screen printing, a metal wiring having desired thickness and pattern can be formed by using an appropriate screen mask.

After applying the metal paste, a calcination treatment (heat treatment) is performed for sintering the silver particles, and thus the sintered body is generated. The calcination treatment is performed for purposes of volatilizing/removing the solvent of the metal paste, the conditioner, and the protective agent (amine compound). The calcination treatment is performed preferably at 50° C. or more and 200° C. or less. At a temperature less than 50° C., it takes a long time to volatilize the solvent and the like, and the sintering of the silver particles is difficult to proceed. On the other hand, at a temperature over 200° C., it is concerned that the substrate may be deformed or thermally damaged. A calcination time is preferably 3 minutes or more and 120 minutes or less. It is noted that the calcination process may be performed under the air atmosphere, or may be performed under a vacuum atmosphere/reduced pressure atmosphere/inert gas atmosphere. Besides, for purposes of removing the solvent or removing the protective agent, a washing treatment with a poor solvent may be performed before and after the calcination treatment. As the solvent used in performing the washing treatment, water or a high-polar organic solvent such as an alcohol is preferred.

Through the application of the metal paste, and the sintering/binding of the metal particles by calcination, the metal wiring is formed. Through this formation of the metal wiring, the conductive sheet is produced. In the thus produced conductive sheet, forming the above-described coating layer or the like may be appropriately performed.

Advantageous Effects of Invention

As described so far, the metal wiring containing the sintered body of the silver particles of the present invention is good in bending resistance, and is difficult to change in electrical characteristics even through repetitive bending deformation. In particular, even against repetitive bending deformation having a very small curvature radius of 1 mm or less, and further 0.5 mm or less, a good resistance value can be kept.

DETAILED DESCRIPTION OF THE PREFERRED EMBODIMENTS

First Embodiment: A preferred embodiment of the present invention will now be described. In the present embodiment, silver particles having appropriate average particle size and particle size distribution were produced, and a metal paste containing the silver particles and a low molecular weight ethyl cellulose dispersed in a solvent was produced. This metal paste was used for forming a metal wiring on a resin substrate, and bending resistance was evaluated.

[Production of Silver Particles]

As a silver compound used as a raw material, 102.2 g of silver carbonate (silver content: 80.0 g) was used. The silver compound was prepared in a wet state with 37.3 g of water (36.4% by weight with respect to 100 parts by mass of silver carbonate) added thereto. To the silver compound, 3-methoxypropylamine (in a 6-fold amount in a molar ratio of the silver mass in the silver compound) was added as an amine compound of a protective agent to produce a silver-amine complex. The silver compound and the amine were mixed at room temperature, and an area of an uncomplexed portion of the silver compound was properly reduced.

In the silver-amine complex, water was added if necessary in consideration of a water content. A water content in a reaction system was checked before heating. In the reaction system in which the water content had been checked, the silver-amine complex was decomposed by heating from room temperature to precipitate silver particles. As for a heating temperature at this point, a decomposition temperature of the complex was assumed as 110 to 130° C., which was set as an achieving temperature. Besides, a heating rate was set to 10° C./min. In the heating process, generation of carbon dioxide was found from the vicinity of the decomposition temperature. The heating was continued until the generation of carbon dioxide was stopped.

After the heating process, in cooling a reaction solution to room temperature after stopping the heating, the temperature was restored to room temperature with the temperature controlled to obtain a cooling rate of about 0.4° C./min. After the precipitation of silver particles, methanol was added to the reaction solution for washing, and the resultant was centrifuged. The washing and centrifugation were performed twice.

[Production of Metal Paste]

Texanol used as a solvent was kneaded with the silver particles produced as described above, and a low molecular weight ethyl cellulose was further added thereto to produce a metal paste (silver paste). As the low molecular weight ethyl cellulose, a commercially available ethyl cellulose (ETHOCEL(registered trademark) STD7, manufactured by The Dow Chemical Company (number average molecular weight: 17,347)) was used. The content of the silver particles was set to 70% by mass with respect to the entire paste, and the content of the low molecular weight ethyl cellulose was set to 1.95% by mass with respect to the entire paste.

The metal paste produced in the present embodiment was measured for the average particle size and the particle size distribution of the silver particles. In this measurement, the metal paste was appropriately sampled for SEM observation, and in a SEM image thus obtained, respective particle sizes of 500 silver particles were measured by a biaxial average method to calculate an average value (median diameter) and a standard deviation. The silver particles of the metal paste produced in the present embodiment had an average particle size of 120 nm, and a standard deviation of 71.3 nm.

[Production of Conductive Sheet]

The thus produced metal paste was used to produce a conductive sheet. As a substrate, a transparent resin substrate (dimension: 150 mm×150 mm, 38 µm in thickness) constituted of polyethylene terephthalate (PET) was used. The metal paste produced as described above was screen printed on the substrate through a SUS screen mask. Thereafter, the resultant was levelled for 10 minutes, and calcinated at 120° C. for 1 hour, and thus, a conductive sheet provided with a metal wiring of a sintered body of the silver particles was produced. In the present embodiment, a plurality of screen masks were used to form metal wirings (60 mm in length) each having a line width of 0.1 mm, 0.2 mm or 0.5 mm in parallel on the substrate. It is noted that the metal wirings all had a thickness of about 4.1 µm.

[Repetitive Bending Test]

Each conductive sheet (line width: 0.1 mm, 0.2 mm, or 0.5 mm) of the present embodiment produced as described above was subjected to a repetitive bending test to examine bending resistance of the metal wiring. In the repetitive bending test, in an arbitrary one wiring on the produced conductive sheet, terminals were connected to positions 10 mm away from one end and 10 mm away from the other end. In the repetitive bending test, a resistance value of the metal wiring before the test was first measured with a digital tester.

Then, with a curvature radius of bending deformation set to 1.0 mm, the bending deformation was applied along a center line of the substrate of the conductive sheet. In the present embodiment, the bending deformation was applied with the metal wiring disposed inside as illustrated in FIG. 1. When a bent state in which the film was stretched into a V-shape was obtained, the number of times of bending was counted as once, and the bending deformation was applied for 100,000 times. In this repetitive bending test, a resistance value of the metal wiring was measured with a digital tester every 20,000 times of bending. A graph plotting the number of times of bending and a change of the resistance value obtained in this repetitive bending test is illustrated in FIG. 2.

Figure 2:
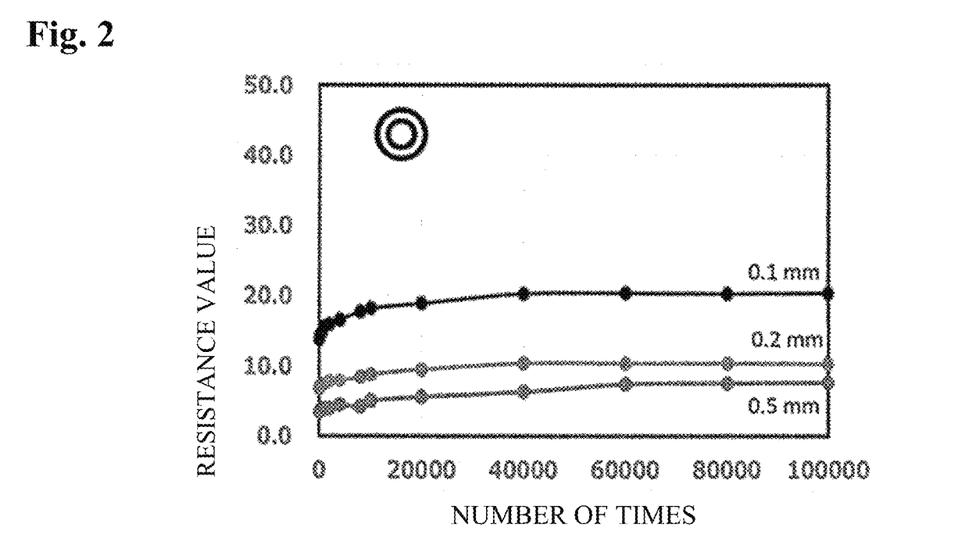
FIG. 2 is a diagram illustrating a result (relation between the number of times of bending and a resistance value) obtained in a repetitive bending test performed on a metal wiring produced in First Embodiment.

As is understood from FIG. 2, the metal wiring produced in the present embodiment was little changed in the resistance value even after the repetitive bending deformation (curvature radius: 1.0 mm) was applied 100,000 times, and exhibited good bending resistance. Specifically, the maximum resistance value ($R_{max}$) observed through the deformation process of 100,000 times was about 1.4 times as large as a resistance value ($R_1$) obtained at an initial stage of the test. It was confirmed that this excellent bending resistance was exhibited even if the metal wiring had a fine line width of 0.1 mm.

Second Embodiment: In the present embodiment, 6 types of silver particles respectively having average particle sizes of 80 nm to 180 nm (respectively referred to as lots a to f; the silver particles of First Embodiment corresponding to the lot c), and two types of silver particles having a sharp particle size distribution with a small standard deviation (respectively referred to as lots g and h) were produced to produce metal pastes. In the production of these silver particles, for adjusting the average particle sizes (in the lots a to f), the amount of a water content to be added was changed in the production process of First Embodiment to adjust the particle sizes. Besides, for adjusting the standard derivation of the particle size (in the lots g and h), a reaction tank was rapidly cooled with cold water in decreasing the temperature after the heating process in the production process of First Embodiment. The average particle sizes and the standard deviations of the particle sizes of the silver particles produced in the present embodiment are shown in Table 1 below.

TABLE 1

| Ag Particle Lot | Average Particle Size (nm) | Standard Deviation (nm) |
| --- | --- | --- |
| a | 80 | 44.5 |
| b | 100 | 41.9 |
| c | 120 | 71.3 |
| d | 140 | 78.3 |
| e | 160 | 77.4 |
| f | 180 | 107.1 |
| g | 80 | 34.5 |
| h | 120 | 32.1 |

Then, each of the 8 types of silver particles described above was dispersed together with a conditioner in a solvent to produce a metal paste. In the present embodiment, in the production of the metal pastes, metal pastes different in the amount of the silver particles to be mixed, and in the type of conditioner (one of, or a combination of both of a low molecular weight ethyl cellulose having a number average molecular weight of 10,000 or more and 60,000 or less, and a high molecular weight ethyl cellulose having a number average molecular weight over 60,000 and 90,000 or less) were produced.

was calculated, and a metal wiring having $R_{max}/R_i$ of 1.5 or less was determined as "excellent", a metal wiring having $R_{max}/R_i$ of 1.5 or more and 2.0 or less was determined as "good", a metal wiring having $R_{max}/R_i$ of 2.0 or more and 5.0 or less was determined as "fair", and a metal wiring having $R_{max}/R_i$ of 5.0 or more was determined as "poor". It is noted that a metal wiring disconnected during the 100,000 times of bending was also determined as "poor". The evaluation results of the bending resistance of the various metal wirings produced in the present embodiment are shown in Table 2.

TABLE 2

| | | Metal Paste | | | | | Physical Properties of Metal Wiring (line width: 0.1 mm) | | | |
|---|---|---|---|---|---|---|---|---|---|---|
| | | Ag Particles | | | Ethyl Cellulose | | | | | |
| Test No. | Ag lot | content (wt %) | Average Particle Size (nm) | Standard Deviation (nm) | Type *1 | Addition Amount *2 | Calcinating Temperature (° C.) | Thickness (μm) | Hardness (GPa) | Young's Modulus (GPa) | Evaluation of Bending Test (R = 1.0 mm) |
| 1 | a | 70 | 80 | 44.5 | Standard | 1 | 120 | 5.0 | 0.48 | 6.70 | poor |
| 2 | b | | 100 | 41.9 | | | | 4.8 | 0.38 | 6.90 | fair |
| 3 | c | | 120 | 71.3 | | | | 4.9 | 0.36 | 7.00 | good |
| 4 | d | | 140 | 78.3 | | | | 4.6 | 0.25 | 5.50 | excellent |
| 5 | e | | 160 | 77.4 | | | | 4.4 | 0.27 | 5.50 | excellent |
| 6 | f | | 180 | 107.1 | | | | 4.3 | 0.29 | 5.90 | excellent |
| 7 | c | | 120 | 71.3 | STD200 | | | 5.0 | 0.31 | 6.70 | fair |
| 8 | | | | | STD100 | | | 5.9 | 0.32 | 6.10 | good |
| 9 | | | | | MIX A | | | 6.1 | 0.32 | 6.50 | good |
| 10 | | | | | STD7 | | | 4.1 | 0.26 | 5.80 | excellent*3 |
| 11 | | | | | STD50 | | | 5.4 | 0.36 | 6.90 | good |
| 12 | | | | | MIX B | | | 6.1 | 0.38 | 6.90 | good |
| 13 | g | | 80 | 34.5 | Standard | | | 4.0 | 0.52 | 7.70 | poor |
| 14 | h | | 120 | 32.1 | | | | 6.5 | 0.36 | 7.80 | poor |
| 15 | c | | 120 | 71.3 | — | 0 | | 5.5 | 0.12 | 5.20 | poor*4 |
| 16 | | | | | Standard | 0.3 | | 3.9 | 0.18 | 5.20 | fair |
| 17 | | | | | | 0.5 | | 4.2 | 0.27 | 5.40 | excellent |
| 18 | | | | | | 0.7 | | 3.9 | 0.26 | 5.40 | excellent |
| 19 | | | | | | 1.1 | | 5.2 | 0.32 | 5.70 | good |
| 20 | b | 75 | 100 | 41.9 | | 1 | | 11.0 | 0.36 | 6.40 | good |
| 21 | c | | 120 | 71.3 | | | | 10.8 | 0.35 | 7.00 | good |
| 22 | f | | 180 | 107.1 | | | | 15.8 | 0.38 | 6.30 | good |
| 23 | c | 70 | 120 | 71.3 | | 1 | 150 | 4.7 | 0.34 | 6.10 | good |

*1 Number average molecular weights of ethyl celluloses are as follows:
STD200: number average molecular weight: 80,733
STD100: number average molecular weight: 63,420
STD50: number average molecular weight: 56,489
STD7: number average molecular weight: 17,347
Standard: mixture of STD100 and STD7 ($C_H/C_L$ = 6.8)
MIX A: mixture of STD100 and STD50 ($C_H/C_L$ = 1.0)
MIX B: mixture of STD100 and STD20 (number average molecular weight: 38,984) ($C_H/C_L$ = 9.0)
*2 The addition amount of ethyl cellulose is shown as a relative amount assuming the addition amount of No. 1 is 1.
The addition amount of ethyl cellulose of No. 1 (Standard) is STD100: 1.70 wt % + STD7: 0.25 wt %
*3 Test No. 10 corresponds to the result of First Embodiment (using the Ag particles of the lot c).
*4 The resistance value could not be measured because the metal wiring was broken to be disconnected through bending applied once.

Then, each of the plurality of metal pastes thus produced was used to form a metal wiring to produce a conductive sheet, and bending resistance was evaluated. The metal wiring was produced in the same manner as in First Embodiment. As for the line width, however, the metal wiring was produced in a line width of 0.1 mm, which was the most severe condition in the evaluation of bending resistance. The evaluation test for bending resistance was performed in the same manner as in First Embodiment. In some examples, a conductive sheet was produced with a calcinating temperature employed after applying the metal paste set to 150° C.

For evaluation of a test result, a ratio ($R_{max}/R_i$) of a maximum resistance ($R_{max}$) obtained during the test to a resistance value ($R_i$) obtained at the initial stage of the test It was confirmed, based on Table 2, that a sintered body (metal wiring) using a metal paste obtained by adding, as a conditioner, an ethyl cellulose having a number average molecular weight of 10,000 or more and 90,000 or less with optimizing the average particle size and the standard deviation of the particle size of silver particles could exhibit good bending resistance. In addition, it is deemed that the resistance value can be retained through repetitive bending deformation when both the hardness and the Young's modulus of the metal wiring are equal to or less than prescribed values.

Referring to the respective constitutions of the metal paste in detail, the metal wiring of the metal paste No. 1 using the silver particles having an average particle size less than 100 nm (80 nm) had too high hardness, and hence was inferior in bending resistance. Besides, the metal pastes containing the silver particles having a small standard deviation of the particle size and having even particle sizes provide metal wirings having high hardness and Young's modulus, and low bending resistance (Nos. 13 and 14). These trends cannot be improved even when the average particle size of the silver particles is optimized.

As for the ethyl cellulose used as the conditioner, the metal wiring using the metal paste containing a low molecular weight ethyl cellulose (number average molecular weight: 60,000 or less) had particularly good bending resistance (No. 10; First Embodiment). Even in using the metal paste containing only a high molecular weight ethyl cellulose (number average molecular weight: over 60,000), the effect of improving the bending resistance of the metal wiring could be probably obtained by optimizing the average particle size and the standard deviation of the silver particles (Nos. 7 and 8). The metal wirings formed using the metal pastes containing both the low molecular weight ethyl cellulose and the high molecular weight ethyl cellulose exhibited good bending resistance (Nos. 2 to 6, and Nos. 9 and 12).

The metal wiring using the metal paste not containing an ethyl cellulose as the conditioner (No. 15) had low hardness, and showed a result of particularly poor bending resistance. In the conductive sheet of this No. 15, the wiring was found broken to be disconnected through bending applied once. On the contrary, in the other conductive sheets evaluated as "poor" in the bending test (Nos. 1, 13 and 14), the resistance values of the wirings were increased after bending, but the wirings were not disconnected. Considering these results, it is deemed that the ethyl cellulose contained in the metal paste was an essential constitution from the viewpoint of preventing wiring disconnection through bending. In order to suppress variation of the resistance value through bending, it is necessary to adjust the particle size and the particle size distribution of the silver particles with the ethyl cellulose added to the metal paste.

Besides, as for the content of the ethyl cellulose, assuming that the addition amounts of No. 1 etc. (1.70% by mass+ 0.25% by mass) are regarded as a standard addition amount, it is deemed, based on the result obtained by a 0.3-fold addition amount (No. 16), that the content is preferably 0.50% by mass or more, and that a content larger than this is preferable for the addition (Nos. 17 to 19).

It is noted that the bending resistance could be secured also when the content of the silver particles in the metal paste was increased to form the metal wiring of 10 μm or more (Nos. 20 to 22). Besides, when an appropriate metal paste was used, the bending resistance of the resultant metal wiring was good even when the calcinating temperature was 150° C. (No. 23).

[Cross-Sectional Structure of Metal Wiring]

Figure 3:
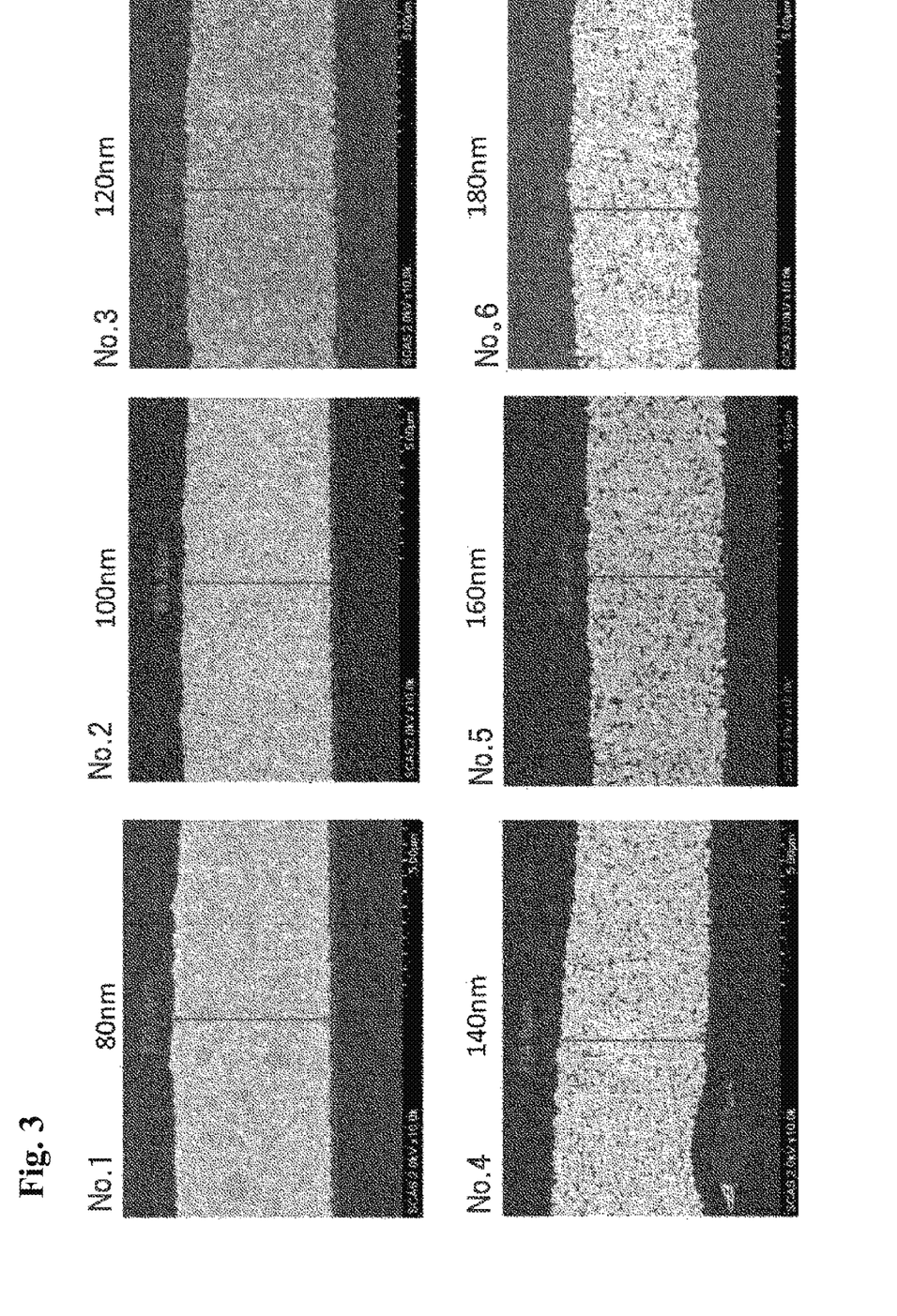
FIG. 3 illustrates SEM photographs of cross-sectional structures of metal wirings No. 1 to No. 6 of Second Embodiment.

FIG. 3 illustrates photographs, obtained through SEM observation, of cross-sectional structures of the metal wirings No. 1 to No. 6 (respectively using the silver particles of the lots a to f). As is understood from FIG. 3, the metal wiring of the silver particles having an average particle size of 80 nm was formed by a dense sintered body, and included a very small number of voids. As the average particle size of the silver particles was increased, the number of voids was increased, but when the average particle size was larger than 140 nm (No. 4), it seems that there was not a large difference in the average particle size and the number (area) of voids. When the cross-sectional structure was similarly observed in other metal wirings in addition to these metal wirings No. 1 to No. 6, it was observed that the cross-sectional structure of a metal wiring having a good result of the repetitive bending test (evaluated as good or excellent) had similar voids.

Third Embodiment: In the present embodiment, the conductive sheets of Nos. 4 to 6, 8, 10, 11 and 21, which showed good results in the repetitive bending test (R=1.0 mm) of Second Embodiment, were subjected to the repetitive bending test under a more severe condition of a curvature radius R of 0.5 mm. The constitutions of the respective conductive sheets (metal wirings) and the other test conditions were the same as those employed in Second Embodiment. Results are shown in Table 3.

TABLE 3

| | | Metal Paste | | | | Physical Properties of Metal Wiring (line width: 0.1 mm) | | | |
| | | Ag Particles | | | Ethyl Cellulose | | | | |
| Test No. | lot | Ag Content (wt %) | Average Particle Size (nm) | Standard Deviation (nm) | Type *1 | Addition Amount *2 | Thickness (μm) | Hardness (GPa) | Young's Modulus (GPa) | Evaluation of Bending Test (R = 0.5 mm) |
|---|---|---|---|---|---|---|---|---|---|---|
| 24 | d | 70 | 140 | 78.3 | Standard | 1 | 4.6 | 0.25 | 5.50 | excellent |
| 25 | e | | 160 | 77.4 | | | 4.4 | 0.27 | 5.50 | excellent |
| 26 | f | | 180 | 107.1 | | | 4.3 | 0.29 | 5.90 | good |
| 27 | c | | 120 | 71.3 | STD100 | | 5.9 | 0.32 | 6.10 | fair |
| 28 | | | | | STD7 | | 4.1 | 0.26 | 5.80 | excellent |
| 29 | | | | | STD50 | | 5.4 | 0.36 | 6.90 | good |
| 30 | | 75 | | | Standard | | 10.8 | 0.35 | 7.00 | fair |

*1 Number average molecular weights of ethyl celluloses are as follows:
STD100: number average molecular weight: 63,420
STD50: number average molecular weight: 56,489
STD7: number average molecular weight: 17,347
Standard: mixture of STD100 and STD7 ($C_H/C_L$ = 6.8)
*2 The addition amount of ethyl cellulose is shown as a relative amount assuming the addition amount of No. 1 is 1.
The addition amount of ethyl cellulose of No. 1 (Standard) is STD100: 1.70 wt % + STD7: 0.25 wt %

It is understood, from Table 3, that the metal wirings of Nos. 24, 25 and 28 (Nos. 4, 5 and 10) exhibited good bending resistance with the resistance values little varied through the bending deformation under the very severe condition of the curvature radius of 0.5 mm (R=0.5 mm).

Referring to No. 27 (No. 8), in the metal wiring using the metal paste in which the high molecular weight ethyl cellulose alone was added as the conditioner, change in the resistance value increased by making severe the condition of the bending test. Even when the high molecular weight ethyl cellulose was contained, however, the severe bending deformation could be coped with by containing also the low molecular weight ethyl cellulose (Nos. 24 and 25 (Nos. 4 and 5)). While in the case where the content of the silver particles in the metal paste was rather high (75% by mass), the bending resistance tended to decrease through bending deformation with a very small curvature radius (No. 30 (No. 21)). It is deemed that a metal paste having a large silver particle content is suitable for forming a thick wiring, but consideration should be paid to the degree of bending deformation to be applied to a conductive sheet.

INDUSTRIAL APPLICABILITY

As described so far, a metal wiring including a sintered body of silver particles of the present invention is good in bending resistance, and is little changed in electrical characteristics even through repetitive bending deformation. As for this bending deformation, very severe deformation with a curvature radius of 0.5 mm can be endured. A conductive sheet of the present invention is provided with a very fine metal wiring, has good bending resistance, and is applicable to a constituent member of a foldable display or a wearable device.

What is claimed is:

1. A metal wiring, to be formed on a flexible substrate, comprising a sintered body of silver particles,
   wherein an average particle size of the silver particles is 100 nm or more and 200 nm or less and a standard deviation of the particle size of the silver particles is 40 nm or more and 120 nm or less, and
   wherein the sintered body has a volume resistivity of 20 μΩ·cm or less, hardness of 0.38 GPa or less, and a Young's modulus of 7.0 GPa or less.

2. The metal wiring according to claim 1, wherein the sintered body has a thickness of 1 μm or more and 20 μm or less.

3. A conductive sheet, comprising a flexible substrate, and a metal wiring formed on at least one surface of the substrate,
   wherein the metal wiring defined in claim 2 is formed as the metal wiring.

4. A conductive sheet, comprising a flexible substrate, and a metal wiring formed on at least one surface of the substrate,
   wherein the metal wiring defined in claim 1 is formed as the metal wiring.

5. The metal wiring according to claim 1, wherein the average particle size of the silver particles is 120 nm or more and 180 nm or less.

6. The metal wiring according to claim 1, wherein the average particle size of the silver particles is 140 nm or more and 180 nm or less.

* * * * *